(12) United States Patent
Fukuyama et al.

(10) Patent No.: US 6,744,076 B2
(45) Date of Patent: Jun. 1, 2004

(54) SINGLE CRYSTALLINE ALUMINUM NITRIDE FILM, METHOD OF FORMING THE SAME, BASE SUBSTRATE FOR GROUP III ELEMENT NITRIDE FILM, LIGHT EMITTING DEVICE AND SURFACE ACOUSTIC WAVE DEVICE

(75) Inventors: Hiroyuki Fukuyama, Tokyo (JP); Kazuhiro Nagata, Tokyo (JP); Wataru Nakao, Tokyo (JP)

(73) Assignee: The Circle for the Promotion of Science and Engineering, Tokyo (JP)

( * ) Notice: Subject to any disclaimer, the term of this patent is extended or adjusted under 35 U.S.C. 154(b) by 0 days.

(21) Appl. No.: 10/247,539

(22) Filed: Sep. 20, 2002

(65) Prior Publication Data

US 2003/0176001 A1 Sep. 18, 2003

(30) Foreign Application Priority Data

Mar. 14, 2002 (JP) ........................................ 2002-070229

(51) Int. Cl.$^7$ .............................................. H01L 21/06
(52) U.S. Cl. ..................................................... 257/103
(58) Field of Search ........................... 257/103, 22, 190; 438/22

(56) References Cited

U.S. PATENT DOCUMENTS 5,741,724 A * 4/1998 Ramdani et al. ............ 437/128

FOREIGN PATENT DOCUMENTS

| JP | 2-141495 A | 5/1990 |
| JP | 2-153897 A | 6/1990 |

* cited by examiner

Primary Examiner—David Nelms
Assistant Examiner—Quoc Hoang
(74) Attorney, Agent, or Firm—Birch, Stewart, Kolasch & Birch, LLP

(57) ABSTRACT

A single crystalline aluminum nitride laminated substrate comprising a single crystalline α-$Al_2O_3$ substrate such as a sapphire substrate, an aluminum oxynitride layer formed on the substrate and a single crystalline aluminum nitride film as the outermost layer, wherein the dislocation density in the single crystalline aluminum nitride is $10^8/cm^2$ or less.

The above single crystalline aluminum nitride laminated substrate is formed by nitriding the substrate by heating in the presence of carbon, nitrogen and carbon monoxide.

The above single crystalline aluminum nitride film has a law dislocation density, little lattice mismatching and excellent crystallinity. A Group III element nitride film having excellent luminous efficiency can be formed on this aluminum nitride film. The above laminated substrate is used in a base substrate for a Group III element nitride film, a light emitting device and a surface acoustic wave device.

8 Claims, 5 Drawing Sheets

F I G. 1   schematic diagram of a reactor

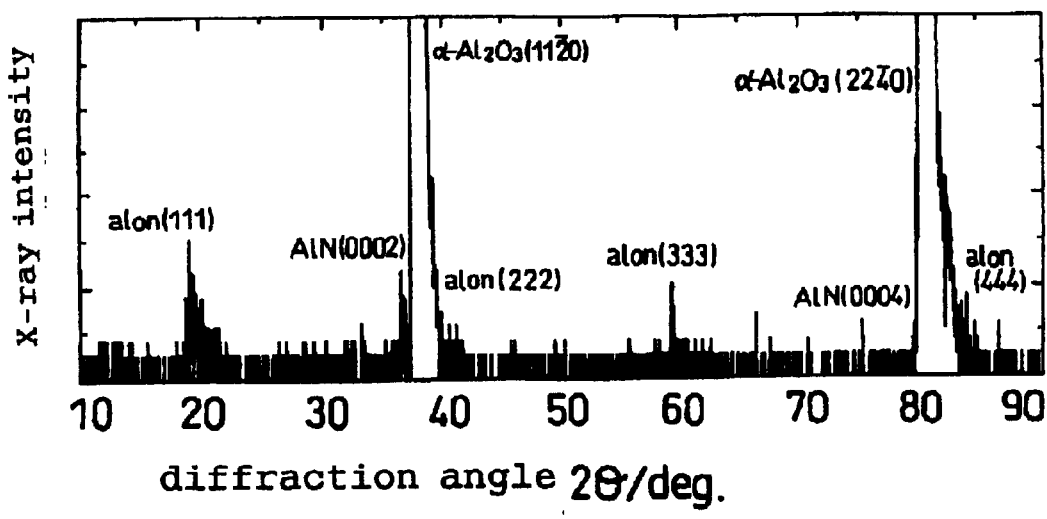
F I G. 4
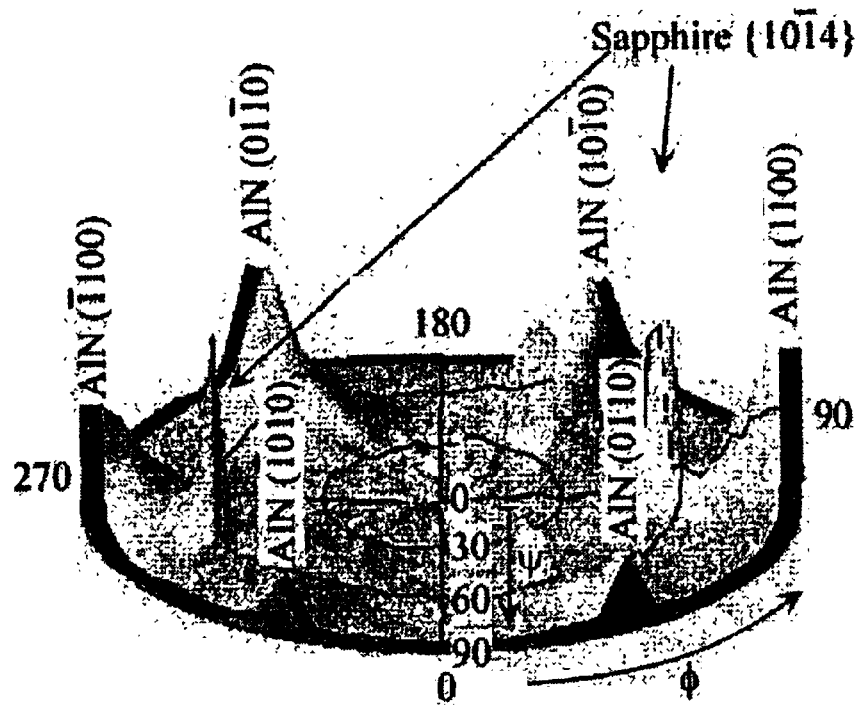
F I G. 5  pole figure of A-face sapphire

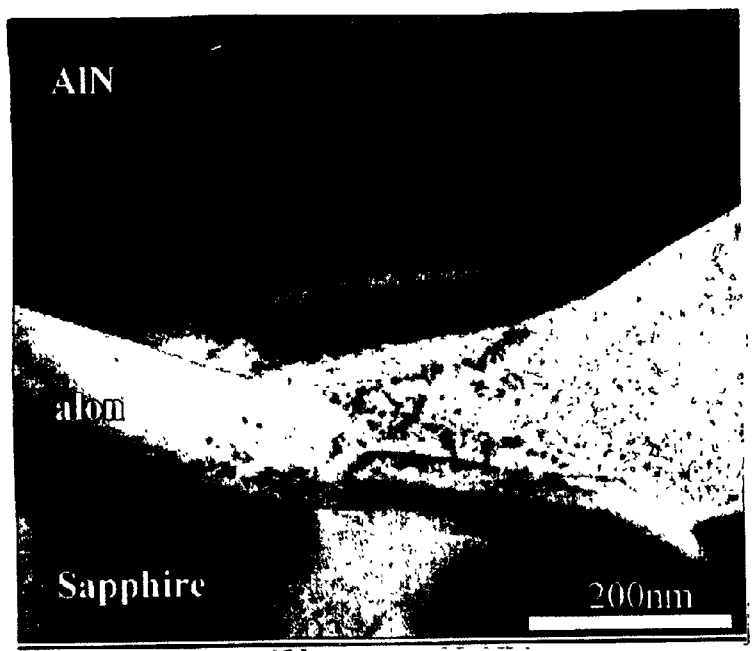
F I G. 6  TEM (A-face sapphire)
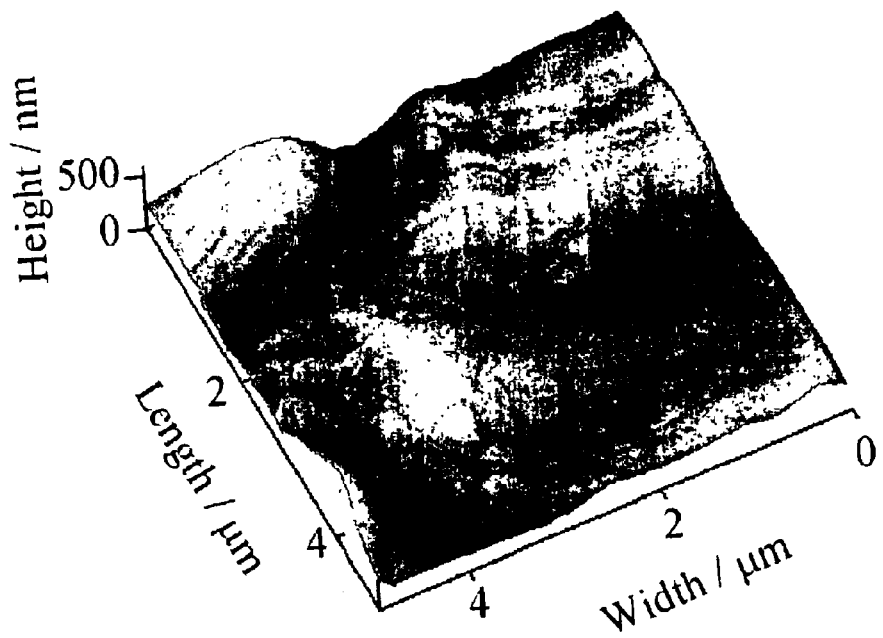
F I G. 7  AFM (A-face sapphire)

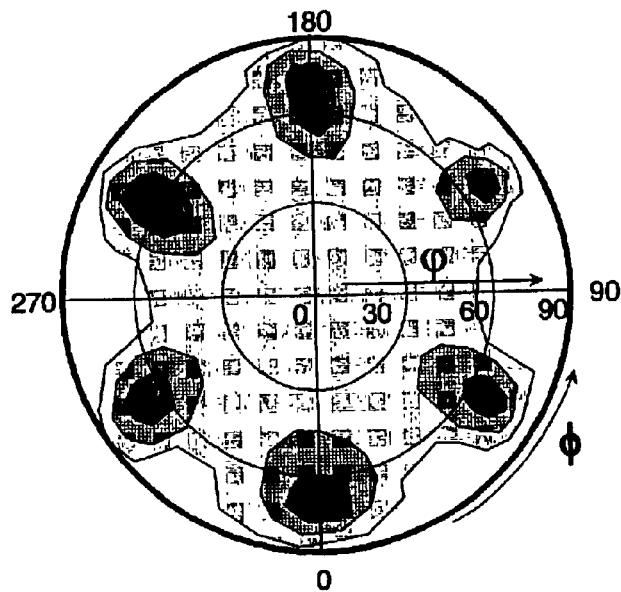
F I G. 8  pole figure of C-face sapphire
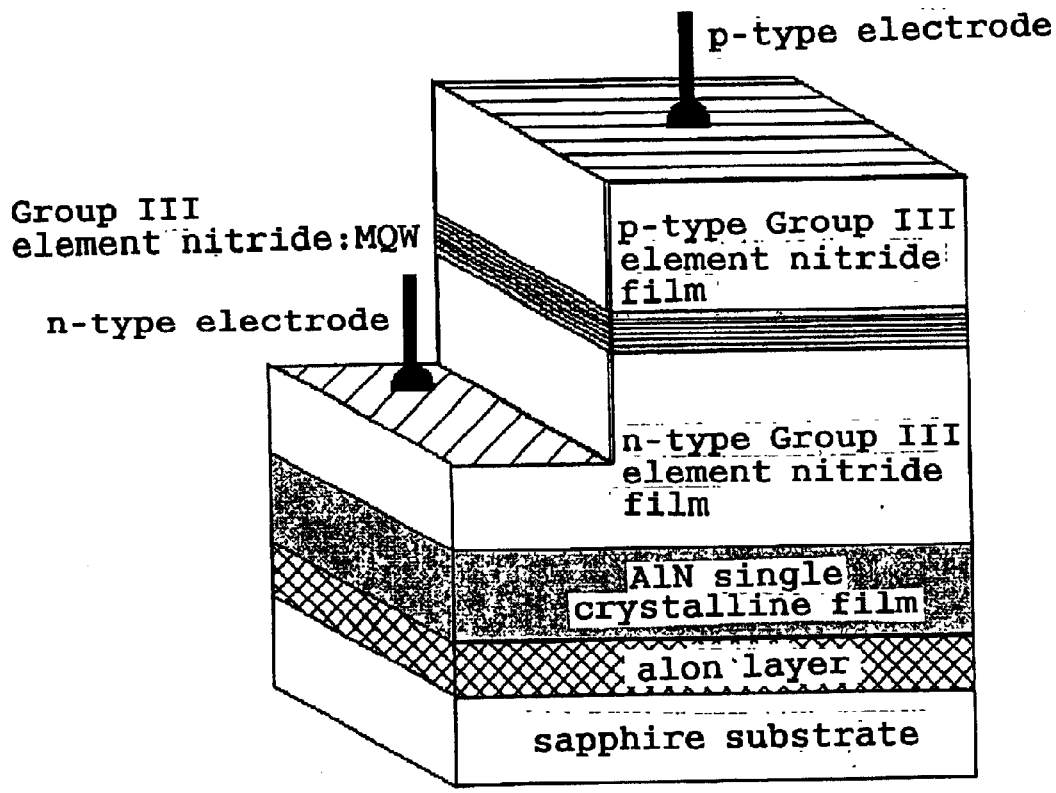
F I G. 9

SINGLE CRYSTALLINE ALUMINUM NITRIDE FILM, METHOD OF FORMING THE SAME, BASE SUBSTRATE FOR GROUP III ELEMENT NITRIDE FILM, LIGHT EMITTING DEVICE AND SURFACE ACOUSTIC WAVE DEVICE

DETAILED DESCRIPTION OF THE INVENTION

1. Field of the Invention

The present invention relates to a single crystalline aluminum nitride (AlN) film, a method of forming the same, which can ensure highly efficient formation of an aluminum nitride film, a base substrate for a Group III element nitride film, a light emitting device and a surface acoustic wave device.

2. Description of the Prior Art

Special attention has recently been paid to group III element nitride semiconductors typified by a gallium nitride (GaN)-based semiconductor as materials for light emitting devices such as a blue light emitting diode (LED) and a blue laser. As seen in the laminated structure of a blue LED, a group III element nitride having a high melting point must be epitaxially grown on a substrate such as a sapphire substrate. Due to its great lattice mismatching with the material of the substrate, it is still extremely difficult to obtain a group III element nitride thin film having few defects. Since the initial crystal growth on the substrate is the major factor in determining the luminous efficiency of a group III element nitride-based semiconductor device, the development of substrate materials which have excellent lattice matching with the above nitride is the most important matter that will bring a major breakthrough in this field.

For the purpose of suppressing lattice mismatching between a sapphire substrate and a group III element nitride, there has been proposed to insert a so-called buffer layer of AlN or the like between the sapphire substrate and the group III element nitride film.

However, since the buffer layer of AlN or the like also has great lattice mismatching with the sapphire substrate, it is difficult to obtain a defect-free homogeneous thin film. In the prior art, a buffer layer is formed on a sapphire substrate by molecular beam epitaxy (MBE), halide vapor-phase epitaxy (HVPE) using aluminum chloride and ammonia, or metal organic vapor-phase epitaxy (MOVPE) using trimethyl aluminum and ammonia. In all of the above methods, large distortion remains at the junction interface between the sapphire substrate and the thin MN film due to great lattice mismatching therebetween. Therefore, the AiN film formed on sapphire becomes a frost column-like assembly structure with a high dislocation density. Accordingly, the conventional AlN film does not sufficiently serve as a buffer layer for growing a GaN film and the GaN film has threading dislocations that thread through the substrate to the film surface at a density of $10^8$ to $10^7/cm^2$. This is the main factor that lowers the luminous efficiency of a light emitting device. As a result, the conventional blue LED has a low luminous efficiency of 22% and the conventional ultraviolet LED has a low luminous efficiency of only 7.5%.

As means of suppressing lattice mismatching at the time of depositing GaN on an $MgAl_2O_4$ spinel substrate, there has been proposed a technique which uses an aluminum oxynitride layer as a buffer layer (U.S. Pat. No. 5,741,724). However, as this prior art technique uses a bulky apparatus for MOVPE, MBE or the like to form an aluminum oxynitride layer and forms a GaN film on the aluminum oxynitride layer, it cannot be said that lattice mismatching has been improved sufficiently.

There has been further proposed a technique for a single crystalline laminated substrate comprising a sapphire substrate, an aluminum oxynitride film formed on the substrate and further an aluminum nitride single crystalline thin film formed on the above film (JP-A 2-141495 and JP-A 2-153897) (the term "JP-A" as used herein means an "unexamined published Japanese patent application"). This technique is to grow the aluminum oxynitride film and the aluminum nitride single crystalline thin film on the sapphire substrate by CVD. The formed aluminum oxynitride film has a non-equilibrium phase called "distortion superlattice" in which the concentration of oxygen on the sapphire substrate side produced at a substrate temperature of 1,150° C. is 25 mol % and that on the aluminum nitride side is 0 mol %. This substance differs from cubic γ-spinel type aluminum oxynitride existent at 1,630° C. or higher obtained in the present invention. The aluminum nitride film formed through this aluminum oxynitride film has been evaluated with the half width of an X-ray rocking curve alone and it is not confirmed yet whether the sample is totally single crystalline or not.

SUMMARY OF THE INVENTION

It is an object of the present invention which has been made in view of the above problems to provide a single crystalline aluminum nitride film which has a low dislocation density, little lattice mismatching and excellent crystallinity and can ensure the formation of a Group III element nitride film excellent in luminous efficiency, a method of forming the same, a base substrate for a Group III element nitride film, a light emitting device and a surface acoustic wave device.

The inventors of the present invention have conducted studies on thermodynamics of an aluminum nitride formation reaction using alumina, carbon and nitrogen as reaction raw materials and have found that a single crystalline aluminum nitride film having excellent crystallinity can be formed by converting an alumina component into aluminum oxynitride and aluminum nitride from the surface of a sapphire substrate toward its interior, making use of the above equilibrium reaction and not by forming a thin film of interest on a sapphire substrate by deposition as in the prior art. The present invention has been thus accomplished based on this finding.

According to the present invention, firstly, the above object of the present invention is attained by a single crystalline aluminum nitride laminated substrate comprising a single crystalline α-$Al_2O_3$ substrate, an aluminum oxynitride layer formed on the substrate and a single crystalline aluminum nitride film as the outermost layer, wherein the density of dislocations in the single crystalline aluminum nitride is $10^8/cm^2$ or less.

According to the present invention, secondly, the above object of the present invention is attained by a process for producing a single crystalline aluminum nitride laminated substrate, comprising nitriding a single crystalline α-$Al_2O_3$ substrate to form an aluminum oxynitride layer and a single crystalline aluminum nitride film on the aluminum oxynitride layer so as to produce the above single crystalline aluminum nitride laminated substrate of the present invention.

According to the present invention, thirdly, the above object of the present invention is attained by a method of forming a single crystalline aluminum nitride film, comprising nitriding a single crystalline α-Al$_2$O$_3$ substrate to form an aluminum oxynitride layer and an aluminum nitride film on the aluminum oxynitride layer.

According to the present invention, in the fourth place, the above object of the present invention is attained by a single crystalline aluminum nitride film which can be obtained by the above method of the present invention.

According to the present invention, in the fifth place, the above object of the present invention is attained by a base substrate for a GaN film, which comprises the above single crystalline aluminum nitride laminated substrate of the present invention.

According to the present invention, in the sixth place, the above object of the present invention is attained by a light emitting device which comprises the above single crystalline aluminum nitride laminated substrate of the present invention including a single crystalline aluminum nitride film as a light emitting film.

According to the present invention, in the seventh place, the above object of the present invention is attained by a light emitting device having a semiconductor film made from group III element nitride single crystals on the above single crystalline aluminum nitride laminated substrate of the present invention as a light emitting film.

According to the present invention, in the eighth place, the above object of the present invention is attained by a surface acoustic wave device which comprises the above single crystalline aluminum nitride laminated substrate of the present invention.

In the present invention, an aluminum oxynitride (alon) layer is formed on the surface of a single crystalline α-Al$_2$O$_3$ substrate, for example, a sapphire substrate and a single crystalline aluminum nitride (AlN) film is formed on this alon layer by nitriding the substrate. Therefore, the obtained single crystalline AlN film has an extremely low dislocation density and excellent crystallinity. Accordingly, when this single crystalline AlN film is used as a light emitting device, an ultraviolet light emitting device having extremely high luminous efficiency can be obtained and can be used in a high-density optical memory and also in a wide variety of fields as an ultraviolet light receiving device. Further, when a group III element nitride semiconductor typified by a GaN-based semiconductor is epitaxially grown on this single crystalline AlN film having excellent crystallinity, a group III element nitride semiconductor single crystalline film having extremely high crystallinity and few defects can be formed. Therefore, a blue light emitting device or ultraviolet light emitting device comprising this group IIII element nitride semiconductor single crystalline film has greatly improved luminous efficiency. Further, since single crystalline AlN can be used in a surface acoustic wave device and a single crystalline AlN film having excellent crystallinity is obtained by the present invention, the drive efficiency of a surface acoustic wave device comprising this film can be enhanced.

BRIEF DESCRIPTION OF THE DRAWINGS

FIG. 4 is a graph showing an XRD (X-ray diffraction) profile obtained when thin film X-ray diffraction is carried out on the lamination of an alon layer and an AlN film grown on a sapphire substrate;

FIG. 5 is a diagram showing a pole figure (A-face sapphire) of an AlN film;

FIG. 6 is a diagram showing a TEM image (A-face sapphire) of the cross section of a substrate;

FIG. 7 is a diagram showing an AFM image (A-face sapphire) of the surface of the substrate;

FIG. 8 is a diagram showing a pole figure (C-face sapphire) of an AlN film; and

FIG. 9 is a diagram showing the layer configuration of a light emitting device according to the present invention.

DETAILED DESCRIPTION OF THE PREFERRED EMBODIMENT

The present invention will be described in detail hereinafter. A preferred embodiment of the present invention will be described below.

The single crystalline aluminum nitride substrate of the present invention is preferably such that the crystal face of a single crystalline α-Al$_2$O$_3$ substrate is A face (11-20) and the crystal face of a single crystalline aluminum nitride film is C face (0001). For the sake of convenience, the orientation (11-20) indicates that the coordinate values are 1, 1, -2 and 0.

In the process of the present invention, the single crystalline α-Al$_2$O$_3$ substrate is preferably nitrided by heating in the presence of carbon, nitrogen and carbon monoxide.

The present invention is characterized in that the alon layer and AlN film are formed by directly nitriding the single crystalline α-Al$_2$O$_3$ substrate, for example, a sapphire substrate. Direct nitriding is to nitride the single crystalline α-Al$_2$O$_3$ (α-alumina) based on the following reaction formula using carbon, nitrogen and carbon monoxide as raw materials.

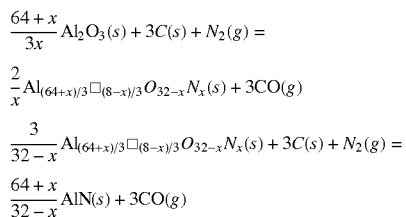

Alon is represented by (Al$_{(64+x)/3}$□$_{(8-x)/3}$O$_{32-x}$N$_x$, □ is a cation vacancy, 2<x<6).

Any commercially available sapphire substrate may be used as the sapphire substrate used in the present invention. Particularly, a sapphire substrate containing air bubbles having a diameter of 50 μm or less, preferably 10 μm or less and a purity of 99.99% or more is preferably used. When an alon layer and an AlN film are to be formed on the surface of this substrate, they may be formed on any crystal face of the substrate but preferably a crystal face other than C face from the viewpoint of crystal symmetry.

Commercially available carbon products may be used. To saturate the reaction atmosphere with carbon, powdery graphite and/or carbon black are/is preferably used. The purity of carbon is preferably 99.9% or more, more preferably 99.999% or more.

Gaseous nitrogen and carbon monoxide are generally used but nitrogen having a purity of 99.9999% or more and carbon monoxide having a purity of 99.9% or more are preferred.

A description is subsequently given of the method of forming an alon layer and an AlN film on the sapphire substrate from the above reaction raw materials.

Figure 2:
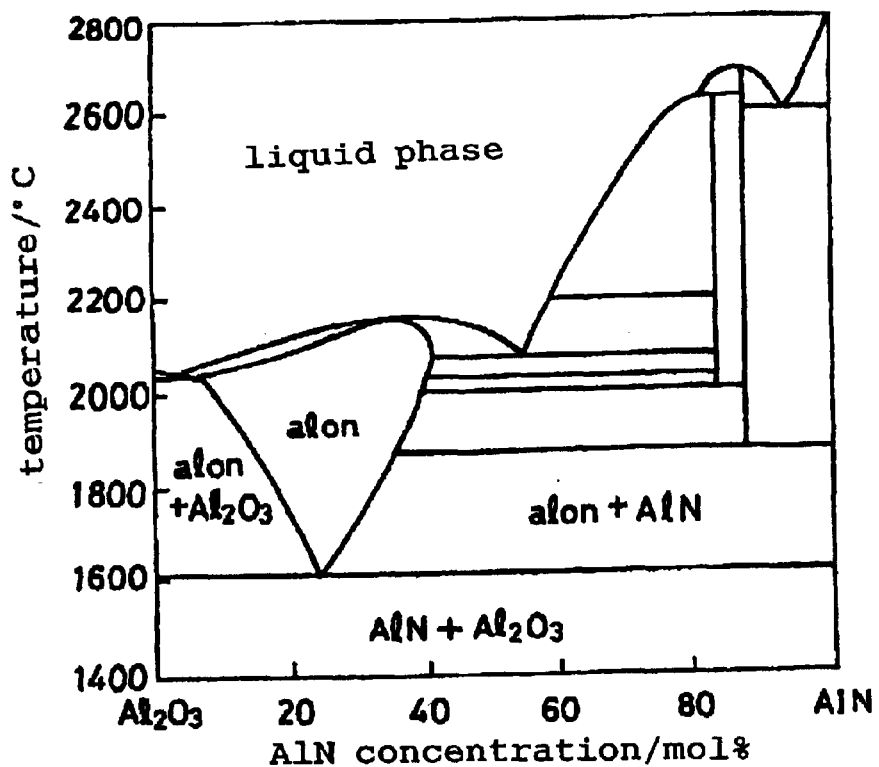
FIG. 2 is a phase diagram of the Al$_2$O$_3$-AlN pseudo binary system.

FIG. 2 is a phase diagram of the $Al_2O_3$-AlN pseudo binary system. As seen from this phase diagram, "alon" is γ-phase ($Al_{(64+x)/3}\square_{(8-x)/3}O_{32-x}N_x$, $\square$ is a cation vacancy) aluminum oxynitride which stably exists only at a high temperature of 1,903K (1,630° C.) or higher and has an inverse spinel structure having a wide solid solution area. This alon is attracting attention as a refractory which has high chemical stability at a high temperature and high corrosion resistance in metal refining. Even polycrystalline alon has high light transmittance at a wide range from a near ultraviolet range to an infrared range and is chemically stable.

Figure 3:
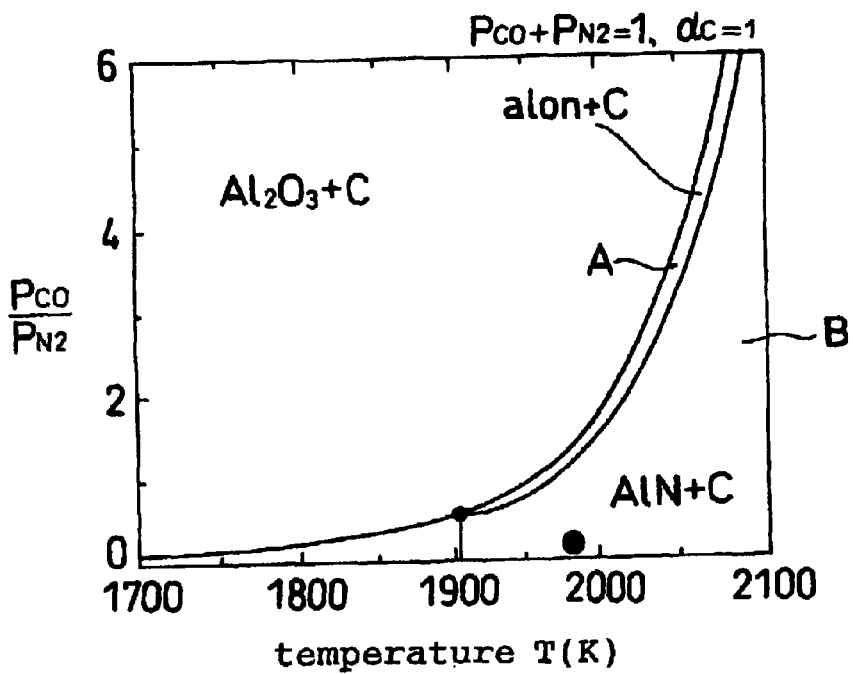
FIG. 3 is a chemical potential diagram of the aluminum-oxygen-nitrogen-carbon system, with temperature (K) plotted on the horizontal axis and the ratio of CO partial pressure $P_{CO}$ to N$_2$ partial pressure $P_{N2}$ plotted on the vertical axis, and shows the phase diagram in FIG. 2 redrawn in terms of the partial pressure ratio $P_{CO}/P_{N2}$ of CO to N$_2$.

In the present invention, this alon is formed by directly nitriding the surface of a single crystalline α-alumina substrate, for example, a sapphire substrate. That is, for example, a sapphire (single crystalline α-$Al_2O_3$) substrate whose surface has A crystal face (11-20) and graphite are placed at the bottom of an $Al_2O_3$ reaction tube shown in FIG. 1 and the substrate is nitrided under an atmosphere of controlled oxygen potential and nitrogen potential by adjusting the composition of an $N_2$-CO mixed gas. The nitriding temperature is set to 1,903K or higher at which alon is produced. Thereby, an alon layer is formed and an AlN film is formed on the alon layer. FIG. 3 is the phase diagram in FIG. 2 redrawn in terms of the partial pressure ratio $P_{CO}/P_{N2}$ of a partial pressure $P_{CO}$ of CO and a partial pressure $P_{N2}$ of $N_2$, with the temperature (K) plotted on the horizontal axis and the ratio $P_{CO}/P_{N2}$ of the CO partial pressure ($P_{CO}$) to the $N_2$ partial pressure ($P_{N2}$) plotted on the vertical axis. This diagram is a phase stability diagram of $Al_2O_3$, alon and AlN under the condition that the total pressure $P_{CO}+P_{N2}$ is 1 atmospheric pressure and the activity $a_c$ of carbon is 1. In the diagram, the area where $P_{CO}/P_{N2}$ is large and the ratio of the CO partial pressure is high is an area where $Al_2O_3$ is stable, area A is an alon-stable area (1,903K or higher) and area B below that area is an AlN-stable area.

In the present invention, by keeping the substrate under formation conditions indicated by the area B in FIG. 3, an AlN film is formed on the topmost surface of the substrate and an alon layer is formed between the substrate and the AlN film. Since $Al_2O_3$ and AlN are directly balanced at a temperature below 1,903K, no alon is produced. However, at a temperature equal to or higher than 1,903K, as apparent from the phase diagram of FIG. 2 and the chemical potential diagram of the aluminum-oxygen-nitrogen-carbon system of FIG. 3, alon always exists between sapphire and AlN as an equilibrium phase. The XRD (X-ray diffraction) profile of FIG. 4 which will be described hereinafter is obtained when alon and AlN are grown at a temperature indicated by ● and a partial pressure ratio of CO to $N_2$ in FIG. 3.

As shown in FIG. 3, by keeping the sapphire substrate at a temperature equal to or higher than the formation temperature of alon (1,903K or higher), an alon layer is formed on the sapphire substrate and further an AlN film having excellent crystallinity is formed on the alon layer. At a temperature lower than the formation temperature of alon, alon is not formed and an AlN film to be formed on the sapphire substrate becomes polycrystal. In the method of forming alon and AlN on a sapphire substrate by keeping the sapphire substrate at a temperature equal to or higher than 1,903K under the condition that the total pressure $P_{CO}+P_{N2}$ is 1 atmospheric pressure and the activity $a_c$ of carbon is 1, for example, the surface of the sapphire substrate is nitrided by gas so that the alon layer and the single crystalline AlN film are formed sequentially while oxygen contained in sapphire and nitrogen supplied from the gas are substituted for each other in sapphire. Unlike the conventional AlN film formed by MOVPE or the like, the obtained single crystalline AlN film has neither a frost column-like assembly structure nor a high dislocation density though it is grown in a uniaxial direction. The AlN film has such excellent crystallinity that a defect cannot be found even by electron microscopy.

As can be understood from the chemical potential diagram of FIG. 3, the amounts and mixing ratio of carbon, nitrogen and carbon monoxide directly used in the nitriding reaction or the heating temperature may be suitably determined, making use of the diagram.

As for the amount of carbon, the weight ratio of carbon to single crystalline α-alumina is preferably 0.1 to 1.

The mixing ratio (partial pressure ratio) of carbon monoxide to nitrogen may be determined from the above chemical potential diagram but preferably in the range of 0.1 to 0.5. The total pressure of the reaction system is preferably 1 atmospheric pressure. This is preferred because the manufacture and operation of a reactor become easy. Prior to the reaction, the inside of the reactor is evacuated and a mixed gas is introduced into the reactor to achieve a predetermined partial pressure. During the reaction, this mixed gas is caused to flow at a predetermined rate.

The heating temperature is selected from a range between the formation temperature of alon (1,903K) and the upper limit temperature (2,149K) at which alon and AlN are directly balanced.

The heating time is suitably determined according to a desired film thickness. For example, the growth speed of a single crystalline aluminum nitride film under the condition that the ratio of $P_{CO}$ to $P_{N2}$ is 0.1 at 1,973K is 0.2 to 0.8 μm/hour.

After the completion of the reaction, the reaction tube is pulled out from the furnace to be quenched. If the cooling speed is low, the alon layer formed between the substrate and the single crystalline aluminum nitride film will decompose disadvantageously.

The present invention is not limited to the case where alon and AlN are formed at the same time by keeping the substrate under the conditions of the area B in FIG. 3. Alternatively, an alon layer may be formed on the substrate first, followed by the formation of an AlN film while changing the formation conditions. As for the formation conditions of the alon layer and AlN film in this case, the alon layer alone is first grown by keeping the substrate under the formation conditions of the area A in FIG. 3, and then the temperature and/or the ratio $P_{CO}/P_{N2}$ are/is altered to change the formation conditions to those of the area B which should be maintained to form the AlN film on the alon layer formed previously.

In this way, the alon layer and the AlN film can be formed successively on the substrate in the same process. FIG. 4 is a graph showing an XRD (X-ray diffraction) profile obtained when thin film X-ray diffraction is carried out on the lamination of the alon layer and the AlN film grown on the sapphire substrate in the above-described manner. In FIG. 4, the horizontal axis represents the diffraction angle 2θ and the vertical axis represents the X-ray intensity. Note that the partial pressure ratio ($P_{CO}/P_{N2}$) in a $N_2$-CO mixed gas was 0.1 and the sapphire substrate was heated in this atmosphere at 1,700° C. for 24 hours. As shown in FIG. 4, the lamination of α-Al$_2$O$_3$ (sapphire substrate) having the orientation of A face, alon having the orientation of (111) and AlN having the orientation of C face is formed.

As shown in FIG. 4, it is understood that the lamination of sapphire, alon and AlN is grown and that the grown alon and AlN are single crystals which have a crystal orientation relationship of A-face sapphire//(111)alon//C-face AlN.

The crystal orientation relationship between the single crystalline aluminum nitride film and the sapphire substrate of the present invention is such as shown below that alon and AlN differ from each other in crystallinity according to the sapphire face of the substrate. This is because alon having three different crystal orientations is grown and becomes polycrystal as C-face sapphire has three isotropic symmetrical axes whereas crystal growth is allowed in only one direction as A-face sapphire does not have an isotropic symmetrical axis. The relationship among the crystal orientation of the sapphire substrate, the crystal orientation of alon and the crystal orientation of the AlN film is given below.

C-face sapphire/(111)alon (polycrystal): offset angle of 20°
 (111)alon (polycrystal)//C-face AlN (polycrystal)

The offset angle represents the angle between crystal faces.

A-face sapphire//(111)alon//C-face AlN

The thickness of the obtained AlN film is generally 0.1 to 20 μm and may be made larger if necessary.

The dislocation density in the single crystalline aluminum nitride film of the present invention is $10^8$/cm$^2$ or less. Since a threading dislocation is not observed from a TEM image of the cross section of the single crystalline aluminum nitride film obtained by the present invention, the above value was calculated as $10^8$/cm$^2$ from the dislocation density (the largest estimated value) on the assumption that one dislocation is existent in the area of 1 μm$^2$ which is the photographic view field.

In the present invention, when lattice mismatching is defined as m.f.=100×(dsub−depi)/depi using the distance d between the most adjacent anions (dsub is the distance between the most adjacent anions of the substrate and depi is the distance between the most adjacent anions of the epitaxial layer), lattice mismatchings at the respective interfaces are expressed as follows.

A-face sapphire substrate/C-face aluminum nitride: 17.0
A-face sapphire substrate/(111)aluminum oxynitride: 8.64
(111)aluminum oxynitride/C-face aluminum nitride: 8.92

That is, the lattice mismatching can be reduced to about half by interposing aluminum oxynitride between sapphire and aluminum nitride.

The cubic γ-spinel type aluminum oxynitride (alon) layer obtained in the present invention is composed of single crystals and has a thickness of about 0.1 μm.

The crystal form and crystallinity of the AlN film and the alon layer can be confirmed by thin film X-ray diffraction, pole figure analysis and the observation of their cross sections through a transmission electron microscope (TEM). Their thicknesses can be confirmed and measured by the TEM observation of their cross sections.

The single crystalline aluminum nitride laminated substrate of the present invention itself can be a light emitting device in which the AlN film serves as a light emitting film. Further, a light emitting device comprising a single crystalline group III element nitride film as a light emitting film can be obtained by further forming the mixed crystal film of arbitrary group III element nitrides such as single crystalline gallium nitride (GaN) or AlGaN and InGaN on this AlN film. Stated more specifically, the single crystalline AlN film itself can be used as an ultraviolet light emitting layer. This AlN ultraviolet light emitting device can be used in a high-density optical memory. The AlN film can be widely used as an ultraviolet light receiving device.

FIG. 9 shows the light emitting device of the present invention. An aluminum oxynitride (alon) layer is formed on a sapphire (single crystalline α-Al$_2$O$_3$) substrate and a single crystalline AlN film is formed on this alon layer by directly nitriding this sapphire substrate. A single crystalline n-type Group III element nitride film is further formed on this single crystalline AlN film which is a buffer layer. This single crystalline n-type Group III element nitride film can be formed by metal organic vapor-phase deposition, halide chemical vapor deposition or molecular beam epitaxy. The obtained n-type Group III element nitride film has extremely excellent crystallinity because the crystallinity of the underlying AlN film is excellent. Since the light emitting device of the present invention comprises the sapphire substrate, the alon layer formed on the substrate and the AlN film formed on the alon layer as described above, the crystallinity of the AlN film can be greatly improved. When an AlN film is formed on the sapphire substrate by MBE or MOVPE, lattice mismatching between the sapphire substrate and the AlN film reaches 17% in the prior art. In contrast to this, when the alon layer is formed and the AlN film is formed on the alon layer by directly nitriding the sapphire substrate as in the present invention, lattice mismatching between the sapphire substrate and the AlN film can be reduced to about 9%. As a result, a high-quality single crystalline AlN film can be formed. Therefore, when a Group III element nitride film is to be formed on this AlN film, a high-quality Group III element nitride thin film having few threading dislocations can be formed. Accordingly, the luminous efficiency of a light emitting device having this Group III element nitride light emitting layer can be drastically improved.

As the single crystalline aluminum nitride laminated substrate of the present invention has greater anisotropy in surface elasticity than a polycrystalline aluminum nitride laminated substrate of the prior art, it can also be used as a high-performance surface acoustic wave device. This surface acoustic wave device can be utilized in, for example, portable telephones, mobile communication, TV intermediate band filters, satellite telephones and the like.

EXAMPLES

Example 1

Figure 1:
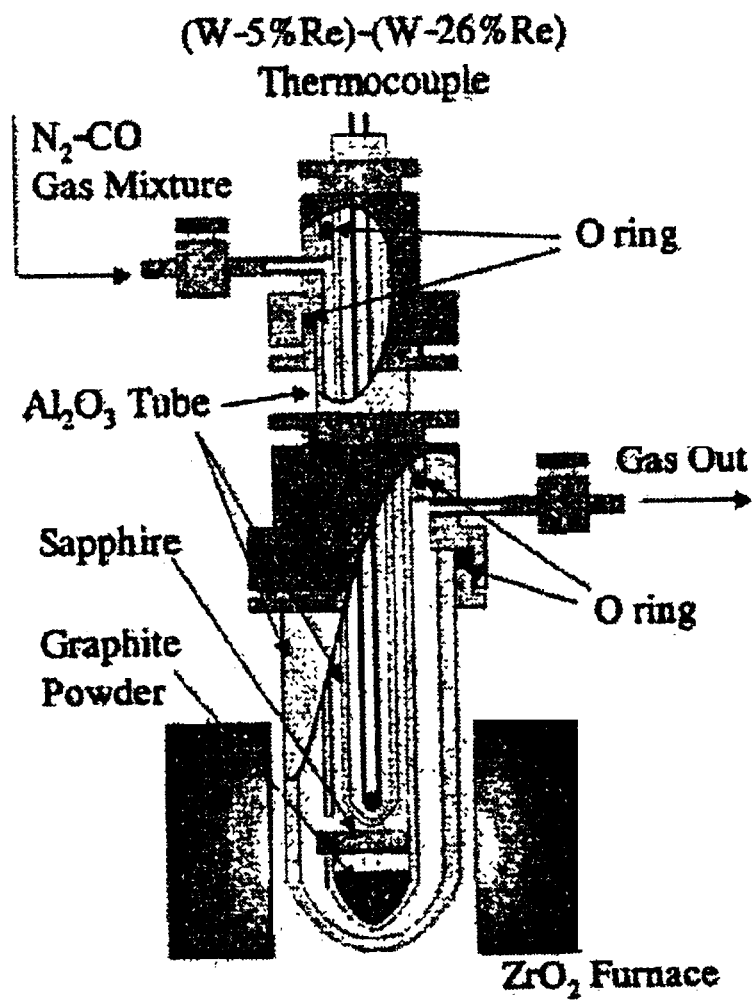
FIG. 1 is a schematic diagram of a reactor used in Examples of the present invention.

AlN and alon phases were formed from an N$_2$-CO mixed gas and graphite at 1,973K by nitriding a sapphire substrate using a reactor shown in FIG. 1. The sapphire substrate (10 mm×10 mm×1 mm) whose surface had A crystal face (11-20) and graphite powders (purity of 99.999%) were placed at the bottom of an Al$_2$O$_3$ reaction tube. The inside of the reaction tube was completely evacuated and dehydrated by a rotary pump in advance and completely substituted by a mixed gas having a ratio of the carbon monoxide (CO) partial pressure to the nitrogen (N$_2$) partial pressure of 0.1. Thereafter, this mixed gas was caused to flow at a fixed rate of 55 ml/min. The total inside pressure of the reactor was 1 atmospheric pressure. The bottom of the reaction tube was inserted into the equalizing portion of a furnace to quickly heat the sample and maintain it at 1,973K so as to start a reaction. After the sample was kept for 24 hours, the reaction tube was pulled out from the furnace to quench the sample, thus completing the reaction.

When the obtained sapphire substrate which went through the reaction was measured by X-ray diffraction analysis, diffraction peaks were observed on the (111) face of alon and the (0002) face of AlN besides the (11-20) face of the sapphire substrate (FIG. 4). It was understood from this that AlN and alon layers formed on the entire surface of the sample had a single crystal orientation. It was also found that the substrate and the formed nitride phases had the following crystal orientation relationship.

(0001)AlN//(111)alon//A-face sapphire

Further, the pole figure of the AlN film formed on the A-face sapphire substrate which went through the reaction is shown in FIG. 5. As a result, it was confirmed that an offset angle was not existent at the above crystal interfaces and that AlN single crystals having high crystallinity were formed.

An TEM image of the cross section of the A-face sapphire substrate obtained in this example is shown in FIG. 6. As shown in the figure, it was seen that three phases different from one another in crystal orientation and crystal structure were formed as layers. When the composition of each of the above phases was analyzed by EDX, an alon layer and an AlN layer were continuously formed on the sapphire substrate. It was further understood from an electron diffraction pattern that the formed alon layer and AlN layer were single crystals and that no dislocation was existent in the area of at least 1 $\mu m^2$. The dislocation density in the formed AlN was about $10^8/cm^2$ at maximum which is one-digit lower than the dislocation density of the prior art.

An atomic force microscopic (AFM) image of the A-face sapphire substrate obtained in this example is shown in FIG. 7. As shown in the figure, the nitrided surface was not smooth and undulations having a maximum height of about 400 nm were seen.

Example 2

AlN and alon phases were formed from an $N_2$-CO mixed gas and graphite at 1,973K by nitriding a sapphire substrate using the experimental device shown in FIG. 1. The sapphire substrate (10 mm×10 mm×1 mm) whose surface had C crystal face and graphite powders (purity of 99.999%) were placed at the bottom of an $Al_2O_3$ reaction tube. The inside of the reaction tube was completely evacuated and dehydrated by a rotary pump in advance and completely substituted by a CO-$N_2$ mixed gas having a $P_{CO}/P_{N2}$ ratio of 0.1. Thereafter, this mixed gas was caused to flow at a fixed rate of 55 ml/min. The total inside pressure of the reactor was 1 atmospheric pressure. The bottom of the reaction tube was inserted into the equalizing portion of a furnace to quickly heat the sample and maintain it at 1,973K so as to start a reaction. After the sample was kept for 24 hours, the reaction tube was pulled out from the furnace to quench the sample, thus completing the reaction.

The pole figure of the AlN film formed on the C-face sapphire substrate which went through the reaction is shown in FIG. 8. As a result, it was confirmed that an offset angle of 20° was existent between C-face sapphire and (111)alon.

C-face sapphire/(111)alon (polycrystal): offset angle of 20°

(111)alon (polycrystal)//C-face AlN (polycrystal)

It is considered from the fact that C-face sapphire had three isotropic symmetrical axes that alon having three different crystal orientations grew, that is, alon became polycrystal and AlN on the outermost face also became polycrystal though oriented on C face.

In contrast to this, since A-face sapphire had no isotropic symmetrical axis as explained in Example 1, crystal growth was allowed in only one direction and therefore single crystalline AlN having excellent crystallinity was obtained.

As described above, according to the present invention, a uniform single crystalline AlN film having excellent crystallinity and few defects can be formed on a single crystalline $\alpha$-$Al_2O_3$ substrate such as a sapphire substrate at a low cost without using a halide-based toxic gas used in halide chemical vapor deposition or an organic metal-based toxic gas used in MOVPE.

When this single crystalline AlN film is used as a buffer layer for the formation of a single crystalline Group III element nitride film, the luminous efficiency of a light emitting device such as a blue light emitting diode or blue laser can be greatly improved. When the single crystalline AlN film is used as an ultraviolet light emitting diode, the luminous efficiency of an ultraviolet light emitting device and the light receiving efficiency of a light receiving device can be greatly improved. Further, this single crystalline AlN film can be implemented as a high-density optical memory and a surface acoustic wave device.

What is claimed is:

1. A single crystalline aluminum nitride laminated substrate comprising:
    a single crystalline $\alpha$-$Al_2O_3$ substrate;
    an aluminum oxynitride layer formed on the substrate; and
    a single crystalline aluminum nitride film as an outermost layer, wherein
    a dislocation density in the single crystalline aluminum nitride is $10^8/cm^2$ or less.

2. The laminated substrate of claim 1, wherein a crystal face of the single crystalline $\alpha$-$Al_2O_3$ substrate is A face and a crystal face of the single crystalline aluminum nitride film is C face.

3. A process for producing a single crystalline aluminum nitride laminated substrate, comprising nitriding a single crystalline $\alpha$-$Al_2O_3$ substrate to form an aluminum oxynitride layer and a single crystalline aluminum nitride film on the aluminum oxynitride layer so as to produce the single crystalline aluminum nitride laminated substrate of claim 1 or 2.

4. The process of claim 3, wherein the single crystalline $\alpha$-$Al_2O_3$ substrate is nitrided by heating in the presence of carbon, nitrogen and carbon monoxide.

5. A base substrate for a GaN film, comprising the single crystalline aluminum nitride laminated substrate of claim 1 or 2.

6. A light emitting device comprising the single crystalline aluminum nitride laminated substrate of claim 1 or 2 including a single crystalline aluminum nitride film as a light emitting film.

7. A light emitting device having a semiconductor film made from group III element nitride single crystals on the single crystalline aluminum nitride laminated substrate of claim 1 or 2 as a light emitting film.

8. A surface acoustic wave device comprising the single crystalline aluminum nitride laminated substrate of claim 1 or 2.

* * * * *